US010036770B2

(12) United States Patent
Kong

(10) Patent No.: US 10,036,770 B2
(45) Date of Patent: *Jul. 31, 2018

(54) SEMICONDUCTOR DEVICE WITH TEST MODE CIRCUIT

(71) Applicant: SK hynix Inc., Gyeonggi-do (KR)

(72) Inventor: Yong-Ho Kong, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 288 days.

This patent is subject to a terminal disclaimer.

(21) Appl. No.: 14/924,438

(22) Filed: Oct. 27, 2015

(65) Prior Publication Data

US 2016/0047854 A1 Feb. 18, 2016

Related U.S. Application Data

(62) Division of application No. 13/720,348, filed on Dec. 19, 2012, now Pat. No. 9,201,111.

(30) Foreign Application Priority Data

Aug. 29, 2012 (KR) .................. 10-2012-0094893

(51) Int. Cl.
G01R 31/3187 (2006.01)
G01R 31/26 (2014.01)
G01R 31/317 (2006.01)

(52) U.S. Cl.
CPC ..... *G01R 31/2607* (2013.01); *G01R 31/2644* (2013.01); *G01R 31/31701* (2013.01); *G01R 31/31724* (2013.01)

(58) Field of Classification Search
CPC ............ G01R 31/2607; G01R 31/3187; G01R 31/31724; G01R 31/31701; G01R 31/2644; G01R 31/317; G01R 31/26
See application file for complete search history.

(56) References Cited

U.S. PATENT DOCUMENTS 5,596,537 A * 1/1997 Sukegawa .............. G11C 29/46
365/201
9,201,111 B2 * 12/2015 Kong ............... G01R 31/31701

* cited by examiner

Primary Examiner — Toan Le
(74) Attorney, Agent, or Firm — IP & T Group LLP

(57) ABSTRACT

A semiconductor device includes a plurality of test entry selection units configured to selectively activate a plurality of test entry signals in response to a test entry code, and a plurality of test operation blocks, corresponding to the respective test entry signals, each configured to be reset in response to activation of the corresponding test entry signal to perform a set test operation corresponding to a test selection code.

8 Claims, 4 Drawing Sheets

SEMICONDUCTOR DEVICE WITH TEST MODE CIRCUIT

CROSS-REFERENCE TO RELATED APPLICATIONS

This application is a division of U.S. patent application Ser. No. 13/720,348 filed on Dec. 19, 2012, now U.S. Pat. No. 9,201,111, which claims priority of Korean Patent Application No. 10-2012-0094893, filed on Aug. 29, 2012. The disclosure of each of the foregoing applications is incorporated herein by reference in its entirety.

BACKGROUND

1. Field

Exemplary embodiments of the present invention relate to a semiconductor design technology, and more particularly, to the technology of testing a semiconductor device.

2. Description of the Related Art

Generally, for defect analysis and performance inspection of a semiconductor device, an internal operation of a semiconductor device is tested by performing a test mode.

There are few hundreds types of test modes of the semiconductor device. Each of unique test entry codes, corresponding to the test modes, determines which test mode enters.

Further, reset operations of each of the test modes need to activate signals that may reset each of the test modes, like test reset signals.

Meanwhile, due to the increased demand for high-speed and high-integration semiconductor devices, types of test modes are gradually increased. To effectively perform inspection of the types of increasingly test modes, a test operation method of grouping a plurality of test modes (e.g., a global test mode reset method) has been used.

By grouping the test modes, it may be possible to greatly reduce the number of control signals required for performing the test modes and such advantages of the simplification by grouping the test modes may increase as the types of the test modes to be performed are increased.

In particular, one signal, such as a group test mode reset signal that may reset a plurality of test modes belonging to a group at a time may substitute the test mode reset signals to reset each of the test modes.

However, as described above, when the test mode reset operation is performed in a group unit in which the plurality of test modes is included, the reset operation needs to be performed in a group unit even when only some test modes are reset, so as to control a setting of some of the plurality of test modes. That is, some test modes and the remaining test modes both may be reset.

As described above, the method of grouping the test modes may simplify the control, but needs to unconditionally reset all of the plurality of test mode operations belonging to the group so as to separately reset only some test mode operations.

SUMMARY

Exemplary embodiments of the present invention are directed to provide a semiconductor device with test mode circuit for supporting a reset operation of grouped test modes and a reset operation of individual test modes.

In accordance with an embodiment of the present invention, a semiconductor device includes a plurality of test entry selection units configured to selectively activate a plurality of test entry signals in response to a test entry code, and a plurality of test operation blocks corresponding to the respective test entry signals, each configured to be reset in response to activation of the corresponding test entry signal and perform a set test operation corresponding to a test selection code.

In accordance with another embodiment of the present invention, a semiconductor device includes a first test group operation unit configured to be reset and enter a test operation mode when a test entry code designate a first given value and selectively perform a plurality of first test operations in response to a test selection code, and a second test group operation unit configured to be reset and enter the test operation mode when the test entry code designate a second given value and selectively perform a plurality of second test operations in response to the test selection code.

DETAILED DESCRIPTION

Figure 1:
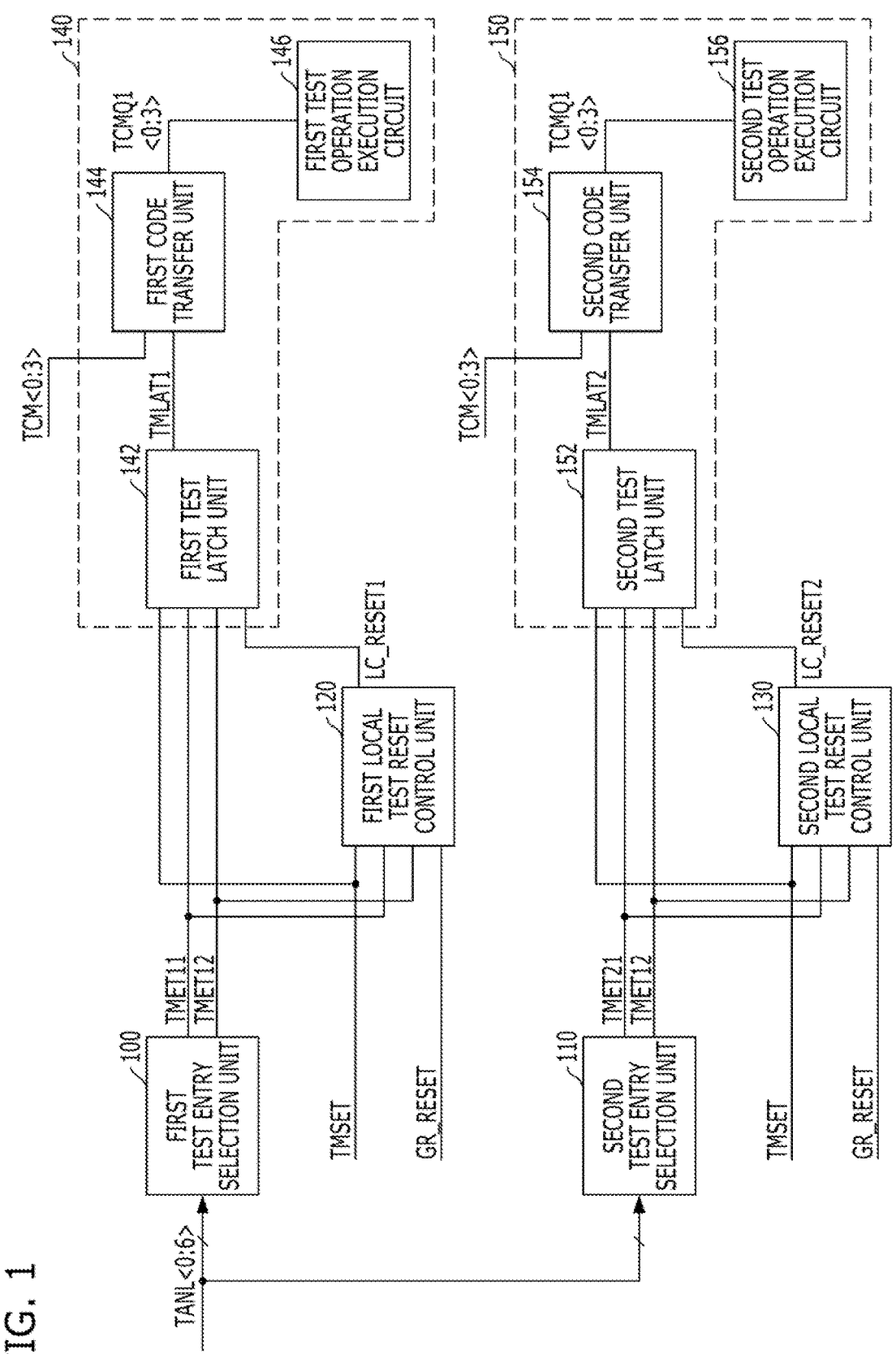
FIG. 1 is a block diagram illustrating a test mode circuit of a semiconductor device in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a block diagram illustrating a test mode circuit of a semiconductor device in accordance with an embodiment of the present invention.

Referring to FIG. 1, a test mode circuit in accordance with an embodiment of the present invention may include first test group operation units 100, 120, and 140 that resets a test entry code TANL<0:6> in response to a first given value and then, enters a test operation mode and selectively performs a plurality of first test operations in response to a test selection code TCM<0:3> and a second test group operation units 110, 130, and 150 that resets the test entry code TANL<0:6> in response to a second given value and then, enters the test operation mode and selectively performs a plurality of second test operations in response to the test, selection code TCM<0:3>. Further, the first test group operation units 100, 120, and 140 and the second test group operation units 110, 130, and 150 are reset in response to a global test reset signal GR_RESET.

For example, in the case in which a first given value of the test entry code TAN<0:6> is "0000001" and a second given value of the test entry code TANL<0:6> is "0000010', the first test group operation units 100, 120, and 140 are reset by themselves and then, enters in the test operation mode when the currently input test entry code TANL<0:6> is "0000001', but do not affect the operation of the second test group operation units 110, 130, and 150. To the contrary, when the currently input test entry code TANL<0:6> is "0000010', the operation of the first test group operation units 100, 120, and 140 is not affected, but the second test group operation units 110, 130, and 150 are reset by themselves and then, enter the test operation mode. Further, the first test group operation units 100, 120, and 140 and the second test group operation units 110, 130, and 150 both are reset in response to the toggling of the global test reset signal GR_RESET.

In detail, the first test group operation units 100, 120, and 140 may include a test entry selection unit 100 the determines whether the test entry code TANL<0:6> has a first given value and first test entry signals TMET11 and TMET12 are activated according to the determined results, a first local test reset control unit 120 that determines whether a first local test reset signal LC_RESET1 is toggled in response to the global test reset signal GR_RESET and the first test entry signals TMET11 and TMET12, and a first test operation execution unit 140 that performs any one of the plurality of first test operations in response to a test selection code TCM<0:3> in a period in which the first test entry signals TMET11 and TMET12 are activated but is reset in response to the toggling of the first local test reset signal LC-RESET1.

Further, the second test group operation units 110, 130, and 150 may include a test entry selection unit 110 the determines whether the test entry code TANL<0:6> has a second given value and second test entry signals TMET21 and TMET22 are activated according to the determined results, a second local test reset control unit 130 that determines whether a second local test reset signal LC_RESET2 is toggled in response to the global test reset signal GR_RESET and the second test entry signals TMET21 and TMET22, and a second test operation execution unit 150 that performs any one of the plurality of first test operations in response to the test selection code TCM<0:3> in a period in which the second test entry signals TMET21 and TMET22 are activated but is reset in response to the toggling of a second local test reset signal LC-RESET2.

Here, the first local test reset control unit 120 toggles the first local test reset signal LC_RESET1 in response to the activation of the first test entry signals TMET11 and TMET12 when the global test rest signal GR_RESET is in an inactivation state. Further, the first local test reset control unit 120 toggles the first local test reset signal LC_RESET1 in response to the toggling of the global test reset signal GR_RESET regardless of whether the first test entry signals TMET11 and TMET12 are activated.

Similarly, the second local test reset control unit 130 toggles the second local test reset signal LC_RESET2 in response to the activation of the second test entry signals TMET21 and TMET22 and toggles the second local test reset signal LC_RESET2 in response to the toggling of the global test reset signal, when the global test rest signal GR_RESET is in an inactivation state.

Further the first test operation execution unit 140 may include a first test latch unit 142 generating a first test operation latch signal TMLAT1 that is set in response to the first test entry signals TMET11 and TMET12 and reset in response to the toggling of the first local test reset signal LC_RESET1, a first code transfer unit 144 that fixes and transfers (TCMQ1<0:3>) the test selection code TCM<0:3> as a reset value in a reset period of the first test operation latch signal TMLAT1, latches a value of the test selection code TCM<0:3> input at the time of converting the reset period into the set period, and then, transfers TCMQ1<0:3> in the set period as it is, and the first test operation execution circuit 146 that selects and executes any one of the plurality of test operation executable in response to the test selection code TCMQ1<0:3> transferred through the first code transfer unit 144 as the first set test operation. In this case, fixing and transferring the test selection code TCM<0:3> input from the first code transfer unit 144 as the reset value means unconditionally fixing and transferring TCMQ1<0:3> as the reset value regardless of the input value of the test selection code TCM<0:3>.

Further, the second test operation execution unit 150 may include a second test latch unit 152 generating a second test operation latch signal TMLAT2 that is set in response to the second test entry signals TMET21 and TMET22 and reset in response to the toggling of the second local test reset signal LC_RESET2, a second code transfer unit 154 that fixes and transfers TCMQ2<0:3> the test selection code TCM<0:3> as a reset value in a reset period of the first test operation latch signal TMLAT2, latches a value of the test selection code TCM<0:3> input at the time of converting the reset period into the set period, and then, transfers TCMQ2<0:3> in the set period as it is, and a second test operation execution circuit 156 that selects and executes any one of the plurality of test operation executable in response to the test selection code TCMQ2<0:3> transferred through the second code transfer unit 154 as the first set test operation. In this case, fixing and transferring the test selection code TCM<0:3> input from the second code transfer unit 154 as the reset value means unconditionally fixing and transferring TCMQ2<0:3> as the reset value regardless of the input value of the test selection code TCMQ2<0:3>.

Further, it may be appreciated that a test mode set signal TMSET is input to the first local test reset control unit 120 and the first test latch unit 142 and the second local test reset control unit 130 and the second test latch unit 152. The test mode set signal TMSET is a signal for preventing a malfunction of components (first local test reset control unit 120, first test latch unit 142, second local test reset control unit 130, second test latch unit 152) that may directly reset the first and second test operation blocks 120 and 140, and 130 and 150). That is, even though the first and second local test reset signals LC_RESET1 and LC_RESET2 are instantly toggled regardless of the operation of the first and second test entry selection units 100 and 110 due to the effect or noise of surrounding environment, the test mode set signal TMSET is a signal for preventing the first and second test operation blocks 120 and 140, and 130 and 150 for being reset in a period in which the test mode set signal TMSET is activated. Therefore, the test mode set signal TMSET may also determine the activation period and the inactivation period according to the test operation period of the first and second test operation blocks 120 and 140, and 130 and 150, a user may determine the activation period and the inactivation period, and the activation period and the inactivation period cannot not yet be present according to the selection of the user. Further FIG. 1 illustrates that the test mode set signal TMSET is commonly input to the first test group operation units 100, 120, and 140 and the second test group operation units 110, 130, and 150, which is only an example. Therefore, different test set signals may each be input to the first test group operation units 100, 120, and 140 and the second test group operation units 110, 130, and 150 in a manner that the first test set signal is input to the first test group operations 100, 120, and 140 and the second test set signal is input to the second test group operation units 110, 130, and 150, according to a designer.

Further, the test entry code TANL<0:6> and the test selection code TCM<0:3> may be input through a given pad from the outside and a variation period and a variation order of the value may also be stored in registers established in the semiconductor device.

Although the embodiment of the present invention is described that the semiconductor device includes the first test groups 100, 120, and 140 and the second test group operation units 110, 130, and 150, the semiconductor device may substantially include more test group operation units as described below.

In detail, the plurality of test group operation units 100, 120, and 140, and 110, 130, and 150 may include the plurality of test entry selection units 100 and 110 that selectively activate (meaning the selective activation of TMET11 and TMET12 or TMET21 and TMET22) the plurality of entry signals TMET11 and TMET12, and TMET21 and TMET22 in response to the test entry code TANL<0:6> and the plurality of test operation blocks 120 and 140, and 130 and 150 that correspond to the plurality of test entry signals TMET11 and TMET12 and TMET21 and TMET22) one to one and are first reset in response to the activation of the corresponding test entry signal and then, performs the set test operations corresponding to the test selection code TCM<0:3>.

Here, the plurality of test entry selection units 100 and 110 each output any one of the plurality of test entry signals TMET11 and TMET12\, and TMET21 and TMET22 and activate the corresponding test entry signals TMET11 and TMET12\, and TMET21 and TMET22 in response to a given value. That is, the plurality of test entry selection units 100 and 110 activate and output only any one of the plurality of test entry signals TMET11 and TMET12, and TMET21 and TMET22 according to the test entry code TANL<0:6> and inactivate and output the remaining signals. Further, the foregoing operation is repeated when the test entry code TANL<0:6> is input.

When any one of the plurality of test entry signals TMET11 and TMET12, and TMET21 and TMET22 is activated, any one of the plurality of test operation blocks 120 and 140, and 130 and 150 corresponding to the activated signals is reset by oneself and enters the test operation mode. Further, the plurality of test operation blocks 120 and 140, and 130 and 150 are each reset in response to the toggling of the global test reset signal. That is, when the corresponding test entry signals TMET11 and TMET12, and TMET21 and TMET22 corresponding to each of test operation blocks are activated, the plurality of test operation blocks 120 and 140, and 130 and 150 may each be reset in response thereto and may be reset in response to the toggling of the global test reset signal GR_RESET.

In detail, the plurality of test operation blocks 120 and 140, and 130 and 150 may each include the local test reset control units 120 and 130 that determine whether the local test reset signals LC_RESET1 and LC_RESET2 are toggled in response to the global test reset signal GR_RESET and the corresponding test entry signals TMET11 and TMET12, and TMET21 and TMET22 and the test operation execution units 140 and 150 that performs the set test operation in response to the test selection code TCM<0:3> in a period in which the corresponding test entry signals TMET11 and TMET12, and TMET21 and TMET22 are activated but are reset in response to the toggling of the local test reset signals LC_RESET1 and LC_RESET2.

Here, the local test reset control units 120 and 130 included in the plurality of test operation blocks 120 and 140, and 130 and 150, respectively, toggle the local test reset signals LC_RESET1 and LC_RESET2 in response to a state in which the global test reset signals GR_RESET is inactivated and the corresponding test entry signals TMET11 and TMET12, and TMET21 and TMET22 are inactivated and toggles the local test reset signals LC_RESET1 and LC_RESET2 regardless of whether the corresponding test entry signals TMET11 and TMET12, and TMET21 and TMET22 are activated in response to the toggling of the global test reset signal GR_RESET.

Further, the test operation execution units 140 and 150 included in the plurality of test operation blocks 120 and 140, and 130 and 150, respectively, may include a test latch unit that generates the test operation latch signals TMLAT1 and TMLAT2 set in response to the corresponding test entry signals TMET11 and TMET12, and TMET21 and TMET22 and reset in response to the toggling of the local test reset signals LC_RESET1 and LC_RESET2, the code transfer units 144 and 154 that fixes and transfers the test selection code TCM<0:3> as the reset value in the reset period of the test operation latch signals TMLAT1 and TMALT2, latches the value of the test selection code TCM<0:3> input when the reset period is converted into the set period and then, transfers the TCMQ1<0:3> and TCMQ2<0:3> as they are in the set period, and the test operation execution circuits 146 and 156 that select and execute any one of the plurality of executable test operations in response to the test selection code TCMQ1<0:3> transferred through the code transfer units 144 and 154 as the set test operation.

Figure 2:
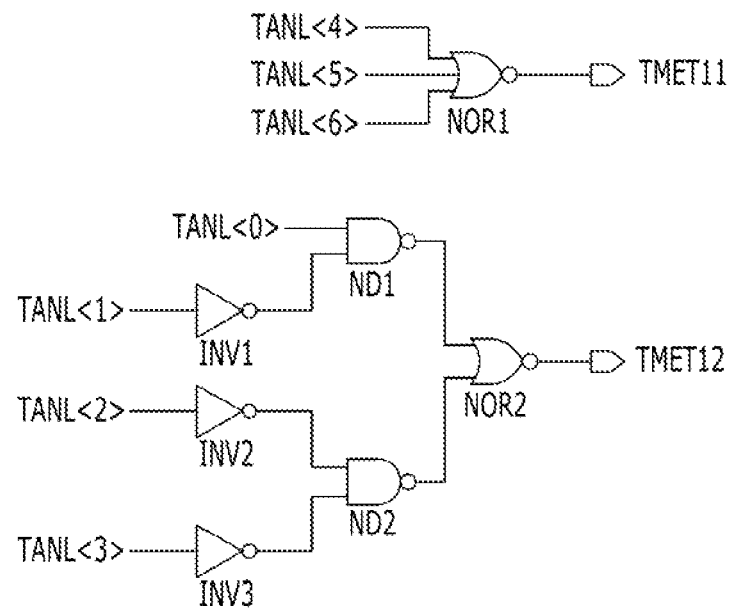
FIG. 2 is a detailed circuit diagram illustrating a test entry selection unit shown in FIG. 1.

FIG. 2 is a detailed circuit diagram illustrating the test entry selection unit 100 shown in FIG. 1.

The circuit configuration of the first test entry selection unit 100 shown in FIG. 2 may be commonly applied to the second test entry selection unit 110 in the same manner with a different combination of input signals. A circuit that may selects and activates the first test entry signals TMET11 and TMET12 in response to the test entry code TANL<0:6> is illustrated. Further, the circuit illustrated in FIG. 2 may be a part of a circuit that selects and activates any one of the plurality of test entry signals when the number of test entry signals is increased.

Describing in detail, the circuit includes an inverter INV1 receiving a first code TANL<1>, a NAND gate ND1 receiving a 0-th code TANL<0> and an inverted code of the first code TAN<1> inverters INV2 and INV3 receiving a second code TANL<2> and a third code TANL<3> respectively, a NAND gate ND2 receiving an inverted code of the second code TANL<2> and the third code TANL<3>, a NOR gate NOR2 that receives fourth to sixth codes TANL<4>, TANL<5>, and TANL<6> and outputs a first signal TMET11 and a NOR gate NOR2 that receives output signals of the NAND gates ND1 and ND2 and outputs a second signal TMET12.

The circuit illustrated in FIG. 2 has a configuration of the first test entry selection unit 100 that activates the test entry signals TMET11 and TMET12 output when the test entry code TANL<0:6> is '0000001'. Therefore, when intending to activate the test entry signal of which the value of the test entry code TANL<0:6> is output corresponding to another value, not '0000001', the configuration of the circuit is slightly changed within a range that may be predicted by those skilled in the art and therefore, the description of the change circuit configuration will not be omitted.

Figure 3:
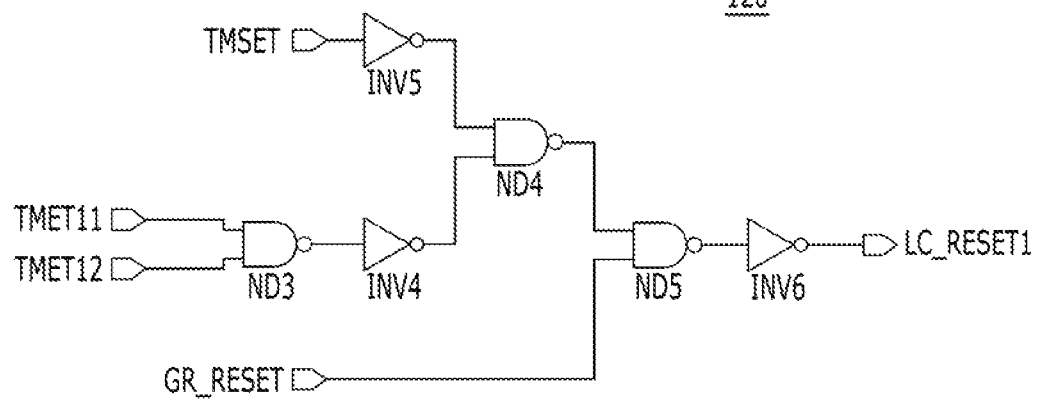
FIG. 3 is a detailed circuit diagram illustrating a local test rest control unit shown in FIG. 1.

FIG. 3 is a detailed circuit diagram illustrating the local test rest control unit 120 shown in FIG. 1.

The circuit configuration of the first local test rest control unit 120 may be applied to the second local test reset control unit 130 in the same manner. A circuit that may toggle the first local test reset signal LC_RESET1 in response to the global test reset signal GR_RESET and the first test entry signals TMET11 and TMET12 is illustrated. Further, the circuit illustrated in FIG. 3 simultaneously toggles the plurality of local test reset signals in response to the global test reset signal GR_RESET when the number of local test reset signals is increased or may be a part of a circuit that toggles any one of the plurality of local test reset signals in response to any one activated signal among the plurality of test entry signals.

Describing in detail, the circuit includes a NAND gate ND3 receiving the first test entry signal TMET11 and the second test entry signal TMET12, an inverter INV4 receiving output signal of the NAND gate ND3, an inverter INV5 receiving a test mode set signal TMSET, a NAND gate ND4 that receives output signals of the inverters INV4 and INV5, a NAND gate ND5 receiving an output signal of the NAND gate ND4 and the global test reset signal GR_RESET, and an inverter INV6 that receives an output of the NAND gate ND4 and outputs the first local test reset signal LC_RESET1.

Describing the circuit illustrated in FIG. 3, the circuit has a configuration of the first local test reset control unit 120 that activates the first local test reset signal LC_RESET1 when first test entry signals TMET11 and TMET12 both are activated as a logic 'high' and the case in which the global test reset signal GR_RESET is toggled. Therefore, the circuit is the same except that only an input signal and an output signal shown in FIG. 3 is different from each other even in the configuration in which other test entry signal instead of the first test entry signals TMET11 and TMET12 are input to toggle other local test reset signals.

Further, describing the circuit illustrated in FIG. 3, the test mode set signal TMSET is input and when the test mode set signal TMSET is not input according to the selection of a designer, the configuration of the circuit is slightly changed within a range that may be predicted by those skilled in the art and therefore, the changed circuit configuration will not be described in more detail herein.

Figure 4:
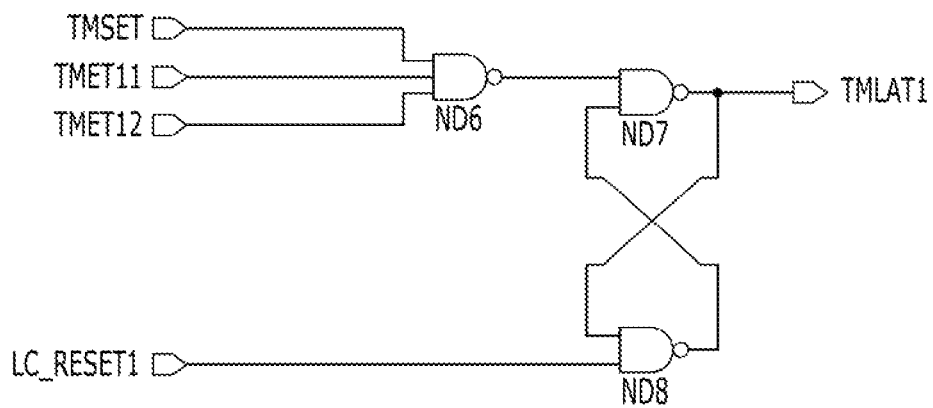
FIG. 4 is a detailed circuit diagram illustrating a test latch unit shown in FIG. 1.

FIG. 4 is a detailed circuit diagram illustrating the test latch unit 142 shown in FIG. 1.

The circuit configuration of the first test latch unit 142 shown in FIG. 4 may be applied to the second test latch units 152 in the same manner. A circuit generating the first test operation latch signal TMLAT1 that is set in response to the first test entry signals TMET11 and TMET12 and reset in response to the first local test reset signal LC_RESET1 is illustrated. Further, the circuit illustrated in FIG. 4 may be a part of the circuit generating a test operation latch signal that is set in response to each of the plurality of test entry signals and is reset in response to the plurality of local test reset signals, respectively, when the number of test operation latch signals is increased.

Describing in detail, the circuit may include a NAND gate ND6 that receives the first test entry signals TMET11 and TMET12 and the test mode set signal TMSET, a NAND gate ND8 that receives the first local test reset signal LC_RESET1 as a reset signal and receives the fed-back first test operation latch signal TMLAT1, and a NAND gate ND7 that receives the output signal of the NAND gate ND6 as a set signal and receives an output signal of the NAND gate ND6. The NAND gates ND7 and ND8 perform an SR latch operation to generate the first test operation latch signal TMLAT1.

Further, describing the circuit illustrated in FIG. 4, it may be appreciated that the circuit has a configuration of the first test latch unit 142 that activates the first test operation latch signal TMLAT1 in a logic 'high' when the first test entry signals TMET11 and TMET12 are activated in a logic 'high' and the test mode set signal TMSET becomes a logic 'high' so that a set input terminal reacts and inactivates the first test operation latch signal TMLAT1 in a logic 'low when the first local test reset signal LC_RESET1 is activated in a logic 'low' and' and the test mode set signal TMSET becomes a logic 'low' so that a reset input terminal reacts.

Therefore, even in the configuration that sets-resets other test operation latch signals by inputting other test entry signals instead of the first test entry signals TMET11 and TMET12 and inputting other test reset signals instead of the first local test reset signal LC_RESET1, the circuit is the same except that only the input signal and the output signal are different from each other.

Further, describing the circuit illustrated in FIG. 4, the test mode set signal TMSET is input and when the test mode set signal TMSET is not input according to the selection of a designer, the configuration of the circuit is slightly changed within a range that may be predicted by those skilled in the art and therefore, the changed circuit configuration will not be described in more detail herein.

Figure 5:
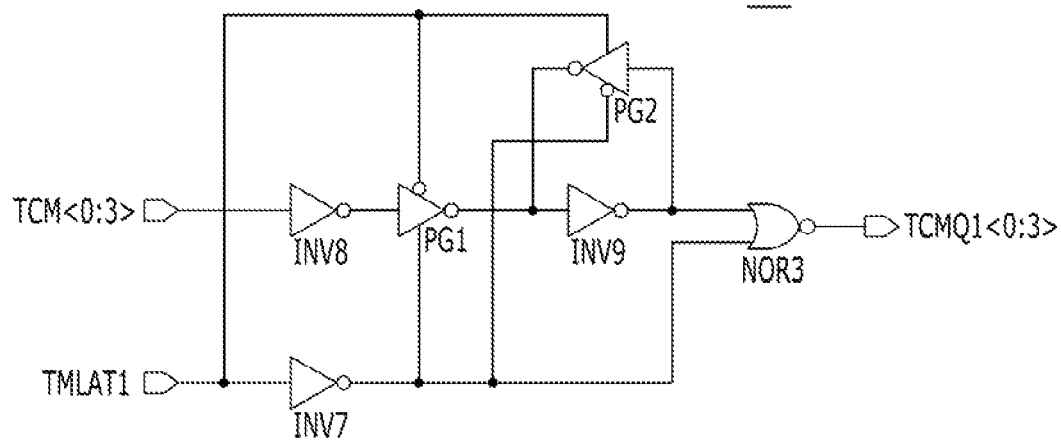
FIG. 5 is a detailed circuit diagram illustrating a test transfer unit shown in FIG. 1.

FIG. 5 is a detailed circuit diagram illustrating the test transfer unit 144 shown in FIG. 1.

The circuit configuration of the first code transfer unit 144 shown in FIG. 5 may be applied to the second code transfer units 154 in the same manner. FIG. 5 illustrates a circuit that fixes and transfers (TCMQ1<0:3>) the test selection code TCM<0:3> input in a period in which the first test operation latch signal TMLAT1 is reset as a reset value and latches the input test selection code TCM<0:3> when the first test operation latch signal TMLAT1 are converted from the reset period into the set period to transfer the test selection code TCM<0:3> latched in the set period of the first test operation latch signal TMLAT1 as it is. Further, when the number of transferred test selection codes is increased, a circuit illustrated in FIG. 5 may be a part of a circuit that determines whether the test selection code input in response to the plurality of test operation latch signals, respectively, is transferred corresponding to the number.

Describing in detail, the circuit includes an inverter INV7 receiving the first test operation latch signal TM LAT1, an inverter INV8 receiving an input test selection code TCM<i>, a 3-state inverter PG1 that selectively inverts the code output from the inverter INV8 in response to the first test operation latch signal TMLAT1 and an output signal of the inverter INV7, an inverter INV9 inverting the code transferred from the 3-state inverter PG1, a 3-state inverter PG2 that selectively inverts the output signal of the inverter INV9 in response to the first test operation latch signal TMLAT1 and the output signal of the inverter INV7 and outputs an output signal to the input terminal of the inverter INV9, and a NOR gate NOR3 that receives the output signal of the inverter INV7 and the output code of the inverter INV9 and outputs a first test selection code TCMQ1<i>. Here, the inverter INV9 and the 3-state inverter PG2 form a latch and latch the output code of the 3-state inverter PG1.

Further, describing the circuit illustrated in FIG. 5, it may be appreciated that the circuit has a configuration of the first code transfer unit 144 that resets and outputs all the transferred first test selection codes TCMQ1<i> as a logic 'low' regardless of the test selection code TCM<i> input when the first test operation latch signal TMLAT1 is activated in a logic 'low' and transfers the latched test selection code TCM<i> as the first test selection code TCMQ1<i> as it is in a period in which the first test operation latch signal TMLAT1 is maintained in a logic 'high' by latching the input test selection code TCM<i> at the instant where the first test operation latch signal TMLAT1 is shifted from a logic 'low' to a logic 'high'.

Therefore, even in the configuration in which the input test selection code TCM<0:3> is transferred as another test selection code by inputting another local test reset signal instead of the first local test reset signal LC_RESET, the circuit is the same except that the input signal and the output signal are different from each other.

Figure 6:
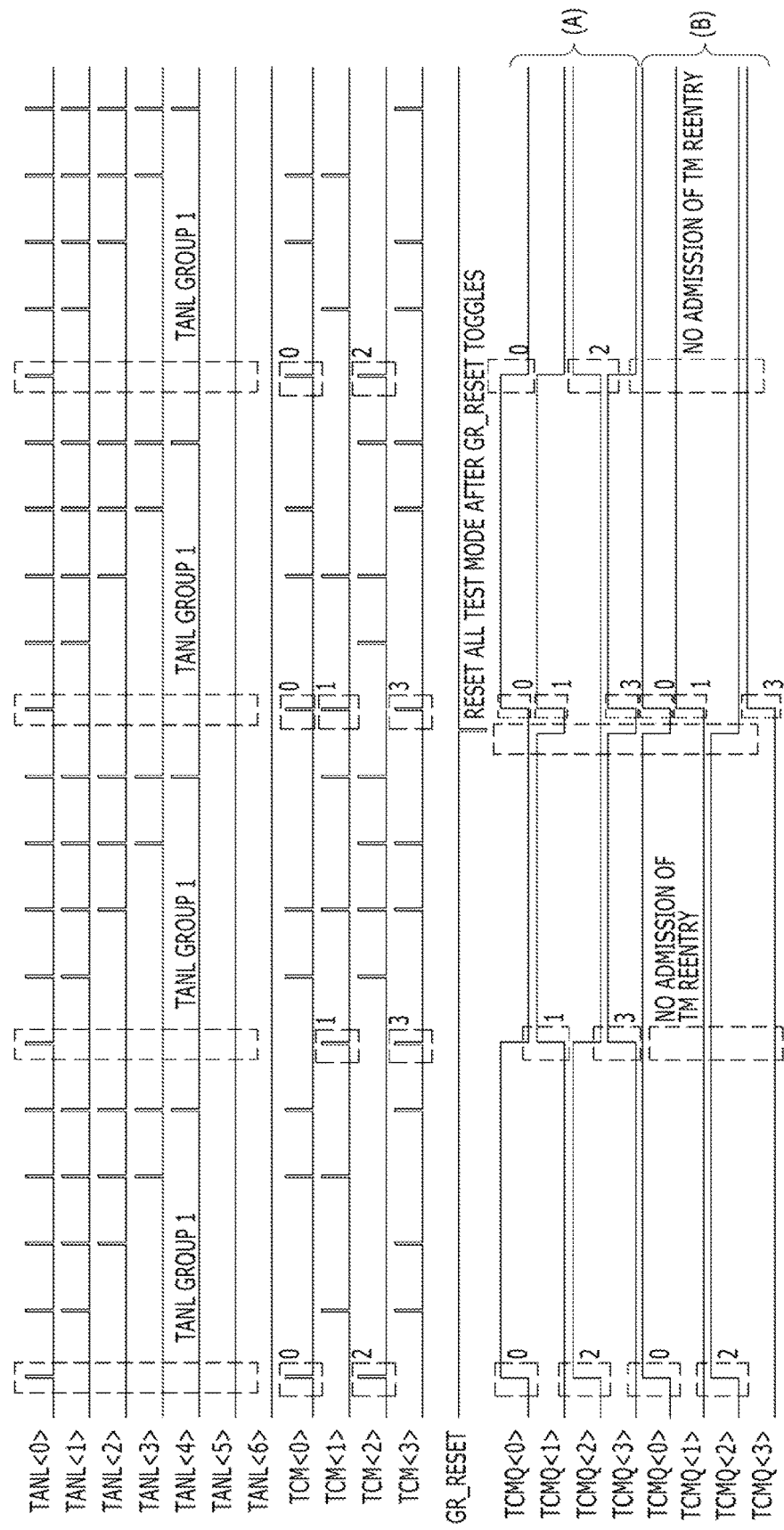
FIG. 6 is a timing diagram for explaining an operation of the test mode circuit of the semiconductor device in accordance with the embodiment of the present invention.

FIG. 6 is a timing diagram illustrating an operation of the test mode circuit of the semiconductor device in accordance with the embodiment of the present invention.

FIG. 6 illustrate a timing diagram under the assumption that a test mode circuit of the semiconductor device in accordance with the embodiment of the present invention includes five test group operation units that determines whether the test mode is entered in response to five different test entry codes TANL<0:6>.

In detail, it is assumed that five different test entry codes TANL<0:6> each have a value of "0000001', '0000011', '0000111', '0001111', and '0011111' and each of the five different test entry codes TANL<0:6> is sequentially input repeatedly.

In this case, in the embodiment of the present invention, when the test entry code TANL<0:5> is input, having a given value, since the test operation circuit is reset and then, enters in the test operation mode, a feature configuration of the present invention may be exhibited by reviewing what reaction is generated when the test entry code TANL<0:6> repeatedly has the given value.

Therefore, in FIG. 6, the embodiment of the present invention mainly describes the operation when the test entry code TANL<0:6> has '0000001' under the assumption that the test entry code TANL<0:6> has a given value of '0000001'.

First, the test selection code TCM<0:3> is input as '1010' when the test entry code TANL<0:5> first has '0000001' and the test operation circuit corresponding to '0000001' that is the test entry code TANL<0:6> enters a specific test mode that may be entered when the test selection code TCM<0:3> is '1010', in response to the '1010'.

As such, after the test operation circuit corresponding to '0000001' that is the test entry code TANL<0:6> enters the specific test mode that may be entered when the test selection code TCM<0:3> is '1010', the test entry code TANL<0:6> sequentially has '0000011', '0000111', '0001111', and '0011111' but does not have '0000001', such that the test operation circuit corresponding to '0000001' that is the test entry code TANL<0:6> does not show any reaction.

Next, the test entry code TANL<0:6> secondly has '0000001' in a period in which the global test reset signal GR_RESET is maintained in an inactivated state as it is. In this case, the test selection code TCM<0:3> is input as '0101' differently before and when the test operation circuit corresponding to '0000001' that is the test entry code TANL<0:6> is the circuit in accordance with the embodiment of the present invention, the test selection code TCM<0:3> enters the specific test mode that may be entered without any problem when the test selection code TCM<0:3> is '0101', in response to the input '1010' but when the test operation circuit corresponding to '0000001' that is the test entry code TANL<0:6> is a circuit in accordance with the related art, the test operation circuit does not exit from the specific test mode that is entered when the test selection code TCM<0:3> is '1010' and the test selection code TCM<0:3> disregards the input as '0101' differently before.

As such, the reason why the operation the test operation circuit in accordance with the embodiment of the present invention (A) are completely different from the test operation circuit in accordance with the related art (B) is that the test operation circuit in accordance with the embodiment of the present invention resets the test mode operation at the instant where the test entry code TANL<0:6> is input as '0000001', such that the test operation circuit may immediately receive the input test selection code TCM<0:3>, but the test operation circuit in accordance with the related art does not toggle the global test reset signal GR_RESET and thus, is not reset, such that the test operation circuit may not immediately receive the subsequently input test selection code TCM<0:3>.

As such, the difference between the test operation circuit in accordance with the embodiment of the present invention and the test operation circuit in accordance with the related art is clear when the global test reset signal GR_RESET is toggled and thus, all the test operation circuits belonging to the group are reset and then, enter the test mode operation again.

In detail, when the global test reset signal GR_RESET is toggled and thus, all the test operation circuits belonging to the group are reset and then, the test entry code TANL<0:6> has '0000001' again, the test operation circuit in accordance with the embodiment of the present invention and the test operation circuit in accordance with the related art both normally enter in the specific test mode that may be entered when the test selection code TCM<0:3> is '1010' when the test selection code TCM<0:3> is input as '1010'. That is, since the test operation circuit in accordance with the related art is reset according to the case in which the global test reset signal GR_RESET is toggled, a new test operation mode may be entered according to the next input test selection code TCM<0:3>.

However, the test entry code TANL<0:6> secondly has '0000001' in a period in which the global test reset signal GR_RESET is again maintained in an inactivated state as it is. In this case, the test selection code TCM<0:3> is input as '0101' differently before and when the test operation circuit corresponding to '0000001' that is the test entry code TANL<0:6> is the circuit in accordance with the embodiment of the present invention, the test selection code TCM<0:3> enters the specific test mode that may be entered without any problem when the test selection code TCM<0:3> is '0101', in response to the input '1010' but when the test operation circuit corresponding to '0000001' that is the test entry code TANL<0:6> is a circuit in accordance with the related art, the test operation circuit does not exit from the specific test mode that is entered when the test selection code TCM<0:3> is '1010' and the test selection code TCM<0:3> disregards the input as '0101' differently before. That is, the test operation circuit in accordance with the related art may not be reset since the global test reset signal GR_RESET is not toggled, such that the test operation circuit does not enter in the new test operation mode regardless of whether the test selection code TCM<0:3> is input. On the other hand, the test operation circuit in accordance with the embodiment of the present invention may enter the new test mode in response to the next input test selection code TCM<0:3> since the test entry code TANL<0:6> is reset at an instant where the '0000001' that is the test entry code TANL<0:6> is input.

As set forth above, since the test operation circuit in accordance with the embodiment of the present invention is reset by oneself only by the operation of simply inputting the test entry code TANL<0:6>, there is no need to perform the global test reset operation that resets all the test operation circuits belonging to the group. Therefore, even when the plurality of test operation circuits are grouped, each test operation may be set without the input of a special command, which may minimize time consumed for a test.

The foregoing present invention is described with reference to a series of functional blocks. However, it will be apparent to those skilled in the art that the foregoing present invention is not limited by the foregoing embodiments and the accompanying drawings but by the claims, and various modifications and changes may be made without departing from the scope and spirit of the invention.

For example, a position and a kind of a logic gate and a transistor illustrated in the foregoing embodiments need to be differently implemented according to the polarity of the input signal.

As set forth above, in accordance with the embodiment of the present invention, in the semiconductor device that controls the test operation of grouping and controlling the plurality of test modes, it may be possible to perform the individual test reset operation even when the plurality of test mode operations are performed in a group unit by performing a control so that the reset operation is automatically performed within the semiconductor device before each test mode newly starts and then, a new test mode operation is performed.

Therefore, time and costs consumed for the test operation is greatly reduced.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
   a first test group operation unit configured to be locally reset and enter a test operation mode when a test entry code designates a first given value and selectively perform a plurality of first test operations in response to a test selection code; and
   a second test group operation unit configured to be locally reset and enter the test operation mode when the test entry code designates a second given value and selectively perform a plurality of second test operations in response to the test selection code,
   wherein the first and second test group operation units are reset in response to a global test reset signal, respectively, before the entering of the test operation mode.

2. The semiconductor device of claim 1, wherein the first test group operation unit includes:
   a first test entry selection unit configured to determine whether the test entry code designate the first given value and activate a first test entry signal according to the result;
   a first local test reset control unit configured to generate a first local test reset signal in respond to the global test reset signal and the first test entry signal; and
   a first test operation execution unit configured to perform one of the plurality of first test operations in response to the test selection code in a period in which the first test entry signal is activated, and to be reset when the first local test reset signal is activated.

3. The semiconductor device of claim 2, wherein the second test group operation unit includes:
   a second test entry selection unit configured to determine whether the test entry code designate the second given value and activate a second test entry signal according to the result;
   a second local test reset control unit configured to generate a second local test reset signal in respond to the global test reset signal and the second test entry signal; and
   a second test operation execution unit configured to perform one of the plurality of second test operations in response to the test selection code in a period in which the second test entry signal is activated, and to be reset when the second local test reset signal is toggled.

4. The semiconductor device of claim 3, wherein when the global test reset signal is in an inactivation state,
   the first local test reset control unit activates the first local test reset signal when the first test entry signal is activated,
   the second local test reset control unit activates the second local test reset signal when the second test entry signal is activated, and
   the first and second local test reset control unit unconditionally activates the first and second local test reset signals when the global test reset signal is activated.

5. The semiconductor device of claim 3, wherein the test operation execution unit includes:
   a first test latch unit configured to generate a first test operation latch signal that is set in response to the first test entry signal and reset when the first local test reset signal is activated;
   a first code transfer unit configured to fix and transfer the test selection code as a reset value in a reset period of the first test operation latch signal and latch a value of the test selection code input when the reset period is converted into a set period, and transfer the value in the set period as it is; and
   a first test operation execution circuit configured to execute the first set test operation in response to the test selection code transferred through the first code transfer unit.

6. The semiconductor device of claim 5, wherein the second test operation execution unit includes:
   a second test latch unit configured to generate a second test operation latch signal that is set in response to the second test entry signal and reset when the second local test reset signal is activated;
   a second code transfer unit configured to fix and transfer the test selection code as a reset value in a reset period of the second test operation latch signal and latch a value of the test selection code input when the reset period is converted into a set period, and transfer the value in the set period as it is; and
   a second test operation execution circuit configured to execute the second set test operation in response to the test selection code transferred through the second code transfer unit.

7. The semiconductor device of claim 1, wherein the test entry code and the test selection code are input through a given pad from the outside.

8. The semiconductor device of claim 1, wherein variation periods and variation sequences of the test entry code and the test selection code have is stored in registers.

* * * * *